(12) United States Patent
Chung et al.

(10) Patent No.: US 6,204,161 B1
(45) Date of Patent: Mar. 20, 2001

(54) SELF ALIGNED CONTACT PAD IN A SEMICONDUCTOR DEVICE AND METHOD FOR FORMING THE SAME

(75) Inventors: Tae-Young Chung, Kyunggi-do; Jae-Goo Lee; Chang-Hyun Cho, both of Seoul, all of (KR)

(73) Assignee: Samsung Electronics, Co., Ltd., Suwon (KR)

( * ) Notice: Subject to any disclaimer, the term of this patent is extended or adjusted under 35 U.S.C. 154(b) by 0 days.

(21) Appl. No.: 09/418,595

(22) Filed: Oct. 15, 1999

(30) Foreign Application Priority Data

Oct. 17, 1998 (KR) .................................. 98-43524

(51) Int. Cl.[7] .......................... H01L 21/336; H01L 21/44
(52) U.S. Cl. .................. 438/612; 438/618; 438/397; 438/253; 438/256; 438/339
(58) Field of Search ................... 438/612, 618, 438/622, 624, 595, 672, 675, 393–399, 587, 253–258, 275, 279, 241

(56) References Cited

U.S. PATENT DOCUMENTS

| | | | |
|---|---|---|---|
| 5,270,240 | * | 12/1993 | Lee ........................ 438/257 |
| 5,286,667 | * | 2/1994 | Lin et al. ................ 438/253 |
| 5,484,741 | * | 1/1996 | Bergemont ............ 438/257 |
| 5,545,578 | * | 8/1996 | Park et al. .............. 438/303 |
| 5,698,072 | * | 12/1997 | Fukuda ................ 156/653.1 |
| 5,736,444 | * | 4/1998 | Kauffman et al. ..... 438/257 |
| 5,882,968 | * | 3/1999 | Jun ........................ 438/254 |
| 6,025,227 | * | 2/2000 | Sung ...................... 438/253 |
| 6,127,260 | * | 10/2000 | Huang .................... 438/629 |

OTHER PUBLICATIONS

Y. Kohyama et al.; "A Fully Printable, Self–Aligned and Planarized Stacked Capacitor DRAM Cell Technology for 1Gbit DRAM and Beyond"; pp. 17–18.

* cited by examiner

Primary Examiner—Charles Bowers
Assistant Examiner—Thanh Nguyen
(74) Attorney, Agent, or Firm—Jones Volentine, L.L.C.

(57) ABSTRACT

Self-aligned contact pads in a semiconductor device and a method for forming the same are provided. These self-aligned contact pads can increase the upper surface of the contact pads to increase alignment margins. Portions of the gate mask are undercut, increasing the spaces between the gate structures. As a result, contact pads that are filled in these spaces have an increased upper surface contacting an electrical contact.

19 Claims, 8 Drawing Sheets

SELF ALIGNED CONTACT PAD IN A SEMICONDUCTOR DEVICE AND METHOD FOR FORMING THE SAME

This application relies for priority upon Korean Patent Application No. 98-43524, filed on Oct. 17, 1998, the contents of which are herein incorporated by reference in their entirety

FIELD OF THE INVENTION

The present invention relates to a semiconductor manufacturing method, and more particularly to a self-aligned contact pad and a method for forming the same.

BACKGROUND OF THE INVENTION

Recently, with the advances in semiconductor fabrication techniques, a trend has proceeded toward smaller design rules for semiconductor devices, e.g., 1 Gbit dynamic random access memories (DRAMs), to the extent that an alignment margin can hardly be secured when aligning a contact plug with a semiconductor layer or interconnect layer underlying the contact plug. Accordingly, for sub-quarter micron semiconductor devices, a manufacturing process is employed which permits the contact plug to be formed by self-alignment with a semiconductor layer or an interconnect layer underlying the contact plug.

The advantages of using a self-aligned contact (SAC) are that a misalignment margin can be increased during a required photolithography process and that a contact resistance can be reduced. For these reasons, emphasis has recently been place upon SAC techniques.

However, as the pattern size of semiconductor devices decreases, there is an increased possibility of a short circuit between a contact hole and a gate line. Contact holes of a high integration density device such as in a memory device inevitably require a high aspect ratio, that is, a smaller surface area comparing with their depth. Therefore, an etch stop phenomenon may occur during the formation of the contact holes. Also, it becomes very difficult to deposit the interlayer insulating film over the fine pattern structure having a high aspect ratio without creating voids and discontinuities in the insulating material.

To solve problems mentioned above, a method has been proposed that uses a contact pad. A conventional method for forming contact hole using an SAC pad will be described below with reference to the FIG. 1 and FIGS. 2A to 2C.

FIG. 1 is a top plan view showing an SAC contact structure according to a conventional semiconductor manufacturing method, and FIG. 2A to FIG. 2C are cross-sectional views of the conventional method for forming the SAC contact pad, which are taken along the line II–II' line of FIG. 1.

Referring to FIG. 2A, a device isolation region 12 is formed over a semiconductor substrate 10 to define active and inactive regions. The device isolation region 12 may be formed by any suitable method well known in the art, for example, shallow trench isolation (STI) or the local oxidation of silicon (LOCOS).

Though not shown, a gate oxide layer is formed by conventional method, e.g., a thermal oxidation method over the entire surface of the substrate. A gate electrode conductive layer and a gate capping insulating layer are laminated over the gate oxide layer in that order. The gate electrode conductive layer is generally laminated with a polysilicon layer 14 and a tungsten silicide layer 16 (first and second gate electrodes), and the gate capping insulating layer is laminated with a first silicon nitride layer 18 and second silicon nitride layer 20 (first and second gate capping layers). In some cases, the second silicon nitride layer 20 can be replaced with a silicon oxide layer. The gate capping layer generally has an etching selectivity with respect to a subsequent interlayer insulating film 26.

Next, a conventional photolithography process is conducted on the gate electrode conductive layer and the gate capping insulating layer to form gate electrode structure 21, i.e., the combination of the first and second gate capping layers 18 and 20 and the first and second gate electrodes 14 and 16.

A low concentration impurity ions are then implanted into the active region of the semiconductor substrate 10 outside of the gate electrode structure 21. A gate spacer 22 is formed to coat the gate electrode structure 21, and this gate spacer 22 has an etching selectivity with respect to a subsequent interlayer insulating film 26. The gate spacer is generally formed of silicon nitride (SiN). Thereafter, high concentration impurity ions are implanted into the active region of the semiconductor substrate 10 outside of the gate spacer 22 in the peripheral region of the semiconductor substrate.

An etch stop layer 24 is formed over the semiconductor substrate 10 and serves as an etching stopper during the step of an SAC etching process. The etch stop layer 24 also has an etching selectivity with respect to the subsequent interlayer insulating film 26, and is formed of, for example, silicon nitride or silicon oxynitride. After the formation of the etch stop layer 24, an interlayer insulating film 26 is deposited over the semiconductor substrate 10 and the gate electrode structures 21.

Referring to FIG. 2B, a photoresist pattern (not shown) is deposited over the interlayer insulating film 26. The interlayer insulating film 26 and the etch stop layer 24 are etched away using the photoresist pattern as a mask to form openings 28a and 28b.

Referring to FIG. 2C, the photoresist pattern is then removed and the openings 28a and 28b are filled with conductive material such as a polysilicon layer. The polysilicon layer is then planarized by a process such as chemical mechanical polishing (CMP) process or an etch-back process to thereby form contact pads, i.e., bit line contact pads 30b and storage node contact pads 30a.

However, in such a conventional method for forming an SAC contact pad, the self aligned contact pattern, i.e., the photoresist pattern, is a circular or elliptical type, as shown in FIG. 1. Therefore as the device pattern size becomes smaller, i.e., as the aspect ratio of the contact hole becomes high, the area to be etched reduces and the depth of the contact hole increases. As a result, during the etching of the interlayer insulating film, the etching rate becomes smaller, in the most severe case, the reaction byproduct cannot diffuse out of the contact hole. In this case, the etching rate can be significantly reduced or etching can cease altogether, i.e., an etch-stop phenomenon can occur.

To solve the etch-stop phenomenon, the etching must be performed under conditions such that the formation of byproduct such as a polymer is suppressed and the etching time is increased. However, in the case of such an etching recipe, the gate capping layer and the gate spacer are also etched during the etching step, thereby resulting in short circuit between the SAC pad and gate.

Y. Kohyama et al, have proposed a method for forming an SAC contact pad that uses a contact pattern merging storage node contact hole and bit line contact hole in an article entitled "A Fully Printable, Self-aligned and Planarized Stacked Capacitor DRAM Cell Technology for 1 Gbit DRAM and Beyond," symposium on VLSI tech, Digest of Technical Papers, pp. 17–18, 1997.

In this proposed method, a gate SAC pattern (which indicates a resist area) is the same as an active area, and is shifted by a half pitch in the gate direction. Therefore, the photoresist pattern area is so small that the polymer formation is very low during the formation of the contact hole. As a result, the etching selectivity between the interlayer insulating film and the nitride layer of gate spacer and gate mask layer becomes poor. This is because the polymer formation is proportional to the photoresist pattern area and the etching selectivity ratio increases with polymer formation.

Furthermore, the SAC contact pad has an upper limit in size between the pair of gate lines. In other words, the contact pads 30a and 30b are formed between the pair of gates 23 as shown in FIG. 1. Therefore, there is still possibility of misalignment between the SAC contact pad and the storage node or bit line.

SUMMARY OF THE INVENTION

The present invention provides an improved SAC contact pad and a method for forming the same. A key feature of the invention is forming a gate mask by laminating at least three material layers, forming the contact pattern including at least two contact regions and undercutting the second material layer of the gate mask in a subsequent SAC process.

Accordingly, an object of the present invention is to provide an SAC contact pad and a method for forming the same that prevents the etch stop phenomenon.

It is a further object of the invention to provide an SAC contact pad and a method for forming the same that increases the upper size of the SAC contact pad thereby increasing the misalignment margin.

It is yet another object of the invention to provide a fully printable SAC contact pad having an increased upper size.

Other aspects, objects, and advantages of the present invention will be apparent to one skilled in the art from a reading of the following disclosure and appended claims.

To achieve these and other advantages and in accordance with the purpose of the present invention, the method is provided for forming the SAC contact pad in a semiconductor device including forming a plurality of stacked conductive structures over a semiconductor substrate, each of the stacked conductive structures comprising a first conductive layer, a multiple capping layer including at least stacked first, second, and third material layers, and a sidewall spacer coating the first conductive layer and the capping layer, and each of the stacked conductive structures being spaced from each other, forming an interlayer insulating film over the semiconductor substrate and the plurality of stacked conductive structures, etching the interlayer insulating film to form openings for contact pads that expose the semiconductor substrate, undercutting the second material layer of the capping layer, filling the opening with a second conductive layer such that the second conductive layer contacts exposed portions of the semiconductor substrate, and planarizing the second conductive layer until upper surfaces of the second material layer of the capping layers are exposed to form the self aligned contact pad that is electrically insulated from an adjacent pad by the second material layer.

The multiple capping layer can further include a fourth material layer over the third material layer. The fourth material layer has an etching selectivity with respect to the underlying third material layer.

The second material layer of the capping layer preferably has different etching selectivity from the first and third material layers of the capping layer. The first material layer preferably comprises an LPCVD nitride, the third material layer preferably comprises polysilicon, and the second layer preferably comprises a material selected from the group consisting of an ARC, a P-nitride, an oxide, and a nitride that has different etching characteristics from the first material layer. The undercutting of the second material layer is preferably performed by wet etching using phosphoric acid.

The forming of the interlayer insulating film comprises forming a first etch stop layer over the semiconductor substrate and the plurality of stacked conductive structures, forming a first interlayer insulating film over the first etch stop layer, etching the first interlayer insulating film between the plurality of stacked conductive structures to expose voids in the first interlayer insulating film, forming a second etch stop layer over the first interlayer insulating film, and forming a second interlayer insulating film over the second etch stop layer to blanket the plurality of stacked conductive structures.

The first interlayer insulating film is etched to a level in height equal to or less than that of the second material layer.

The etching of the interlayer insulating film comprises selectively etching the second interlayer insulating film until upper surfaces of the second etch stop layer are exposed, etching the second etch stop layer and a portion of the sidewall spacer to expose the third material layer, undercutting the second material layer of the capping layer, and etching the first interlayer insulating film and the first etch stop layer.

The first and second etch stop layers preferably have different etching selectivity from the first and second interlayer insulating films. The first and second etch stop layers comprise silicon nitride.

The forming of the first interlayer insulating film preferably comprises depositing a first insulating material over the substrate and the plurality of gate structures, sputtering argon or helium over the substrate and the plurality of gate structures, and performing simultaneously depositing and sputtering a second insulating material over the substrate and the plurality of stacked conductive structures.

The etching of the first interlayer insulating film is performed by one of dry etching, wet etching, and a combination of dry etching and wet etching. The capping layer and spacer preferably have different etching selectivity as compared to the interlayer insulating film. The method may also include planarizing the interlayer insulating film.

The mask pattern preferably has a 'T' shaped opening including at least two contact regions, more particularly, two storage node contacts and one bit line contact.

To achieve these and other advantages, and in accordance with the purpose of the present invention, the method is provided for forming the SAC contact pad in a semiconductor device including forming a plurality of stacked gate structures over a semiconductor substrate, the stacked gate structure comprises a gate electrode conductive layer, a gate mask layer at least including stacked first through third material layers, and a gate spacer coating the gate electrode conductive layer and the gate mask layer, the stacked gate structures being spaced from each other, forming a first etch stop layer over the semiconductor substrate, forming a first interlayer insulating film over the first etch stop layer and the plurality of stacked gate structures, etching the first interlayer insulating film between pairs of the plurality of gate structures to expose voids in the first interlayer insulting layer, forming a second etch stop layer over the first interlayer insulating film, forming a second interlayer insulating film over the second etch stop layer to blanket the plurality of gate structures, forming a mask pattern over the second interlayer insulating film, the mask having a 'T' shaped opening, wherein the 'T' shaped opening portion includes at least two different contact regions of two storage node contact regions and one bit line contact region, etching the second interlayer insulating film, the second etch stop layer, the first interlayer insulating film, and the first etch stop layer, using the mask pattern, to form openings for contact pads that expose the semiconductor substrate, undercutting the second material layer of the gate mask, wherein the undercutting of the gate mask comprises: etching the second interlayer insulating film until the second etch stop layer is exposed, undercutting the second material layer of the gate mask with wet etching in phosphoric acid, etching the first interlayer insulating film until the first etch stop layer is exposed, and removing the first etch stop layer, filling the opening with a contact pad conductive layer, and forming a contact pad by planarizing the contact pad conductive layer such that the second material layer of the gate mask is exposed.

The gate mask layer can further comprise a fourth material layer on the third material layer.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

Figure 3:
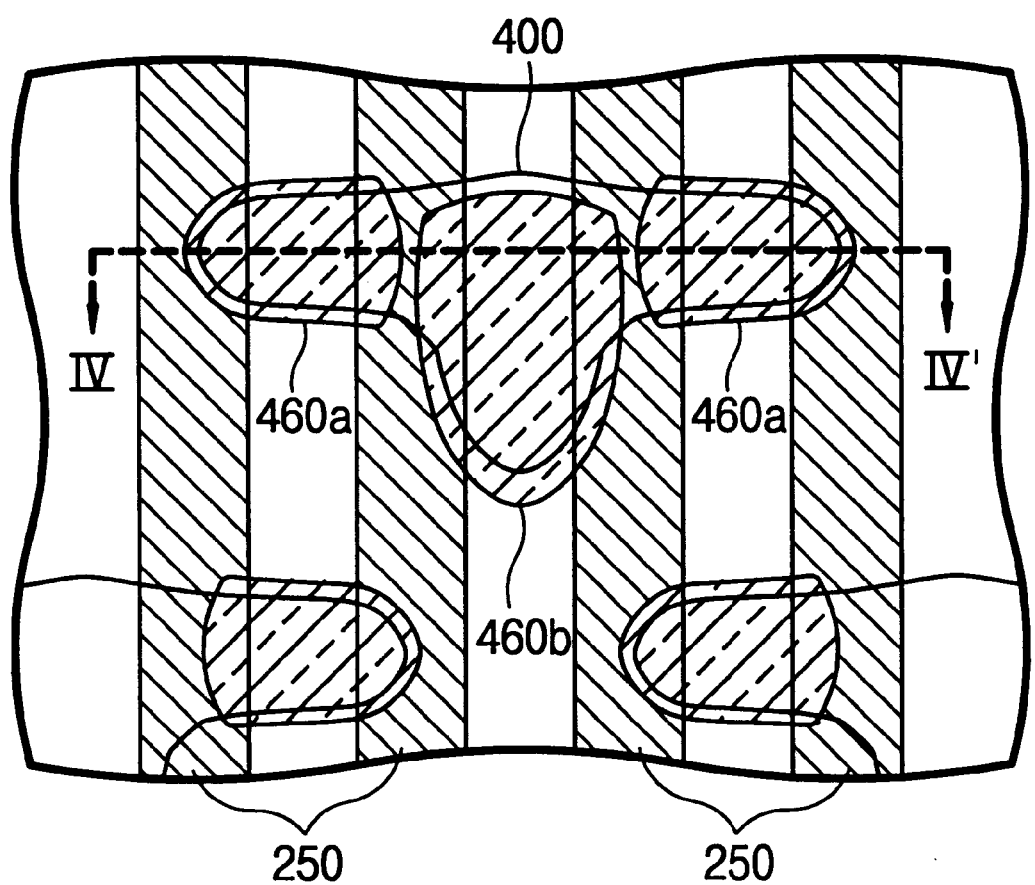
FIG. 3 is a top plan view showing an SAC contact structure according to a preferred embodiment of the present invention.

The preferred embodiment of the present invention will now be described with reference to FIG. 3 to FIG. 5. FIG. 3 is a top plan view showing an SAC contact structure according to a preferred embodiment of the present invention. FIGS. 4A to 4H are cross-sectional views of a preferred embodiment of present invention for forming an SAC contact pad, which are taken along the line IV–IV' of FIG. 3. FIG. 5 is a cross-sectional view showing a completed SAC contact pad according to a preferred embodiment of the present invention.

Referring to FIG. 5, there are provided, a semiconductor substrate 100, a device isolation layer 120, a plurality of gate structures 170, an insulating layer 200, and a plurality of SAC contact pads 460a and 460b. The plurality of gate structures 170 are spaced from each other and are formed over the semiconductor substrate 100. The insulating layer 200 is disposed over and central to each of the plurality of gate structures 170. The SAC contact pads 460a and 460b are each disposed between a pair of the gate structures 170, including the portions of the insulating layer 200 formed over each of the gate structures.

The gate structures 170 preferably includes first and second gate electrode conductive layers 140 and 160, a first material layer 180 (i.e., a first gate mask), and a gate spacer 260. The first and second gate electrode conductive layers 140 and 160 are preferably laminated layers of polysilicon (the first gate electrode conductive layer 140) and a refractory metal silicide (the second gate electrode conductive layer 160). The first material layer 180 and the gate spacer 260 are preferably silicon nitride layers.

The insulating layer 200 is preferably selected from a group consisting of an oxide, a phosphorous nitride (P-nitride), an anti-reflection coating (ARC), and a nitride, and it preferably has different etching selectivity from the first material layer 180 and the gate spacers 260.

Figure 1:
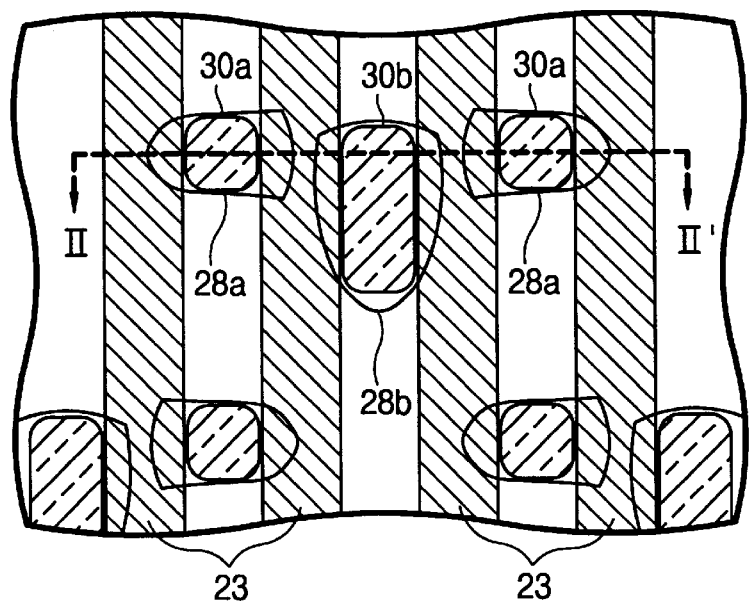
FIG. 1 is a top plan view showing an SAC contact structure according to a conventional method of semiconductor fabrication.
Figure 2A:
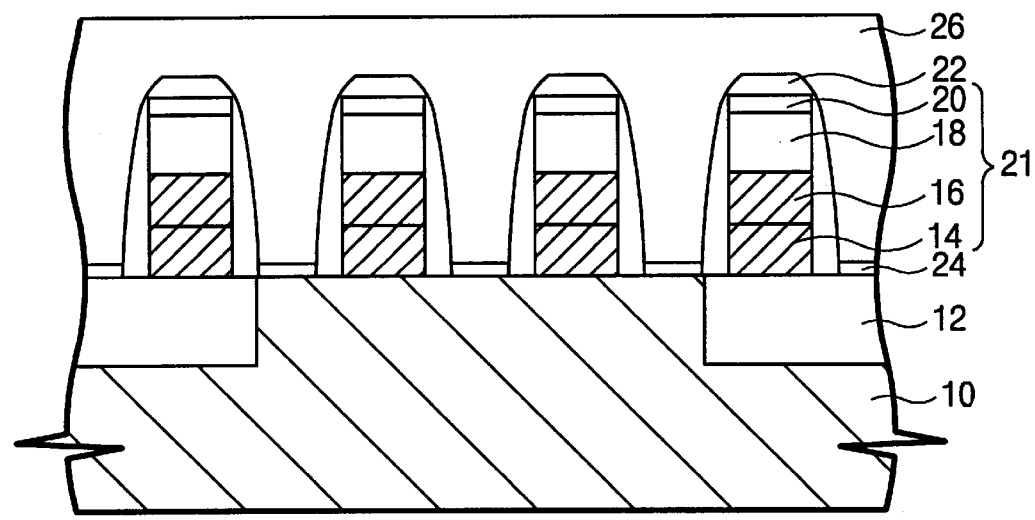
FIG. 2A to FIG. 2C are cross-sectional views of the conventional method for forming the SAC contact pad, which are taken along the line II–II' of FIG. 1.
Figure 2B:
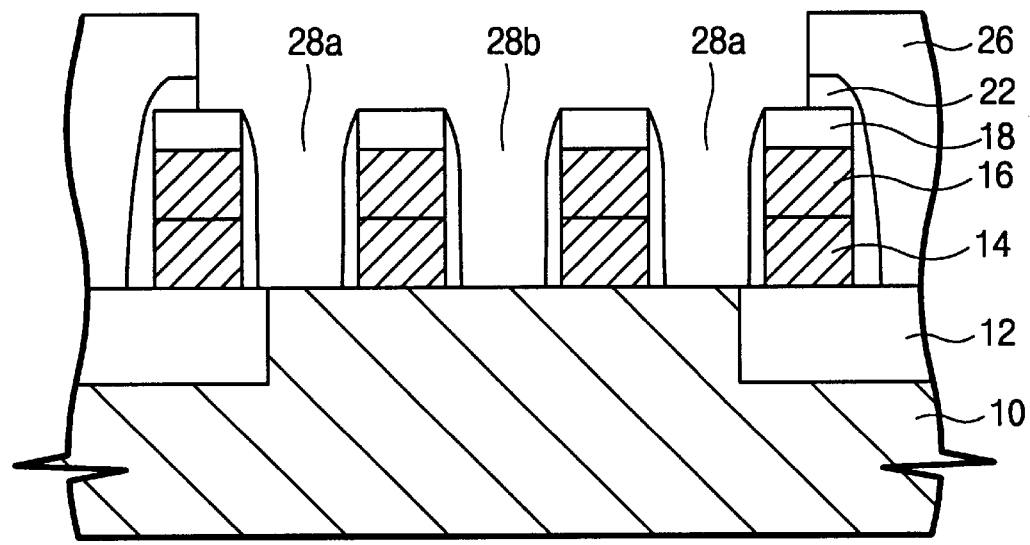
Figure 2C:
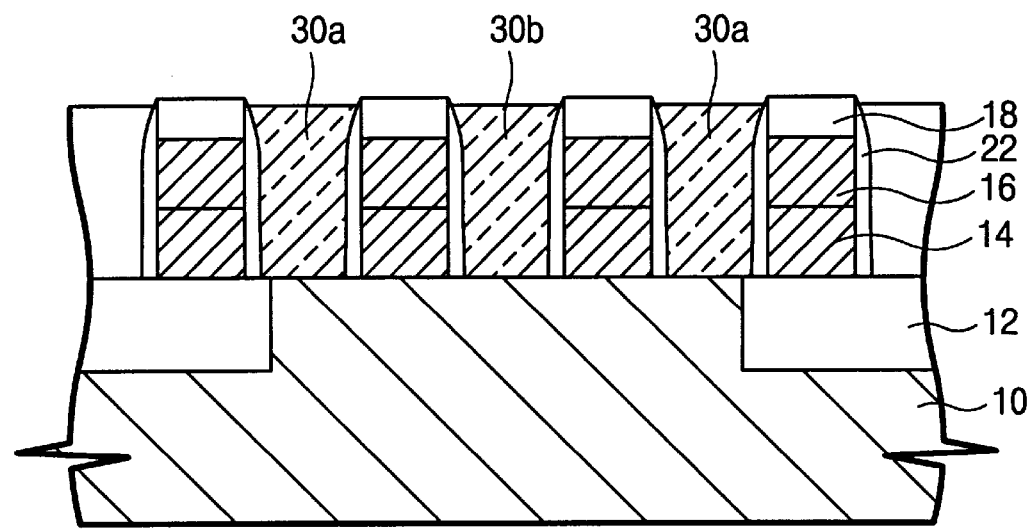

Still referring to FIG. 5, the insulating layer 200 electrically isolates each gate structure 170 and has been undercut to increase the upper size of the contact pads 460a and 460b and to increase the misalignment margin. In other words, as shown in FIG. 3, the contact pads 460a and 460b are formed between pairs of gates structures 170, and are formed over portions of the first and second gate electrode conductive layers 140 and 160 (compare FIG. 1 and FIG. 3).

A preferred method for forming the SAC contact pad shown in FIG. 5 will be described in detail with reference to FIG. 3 and FIGS. 4A to 4H.

Figure 4A:
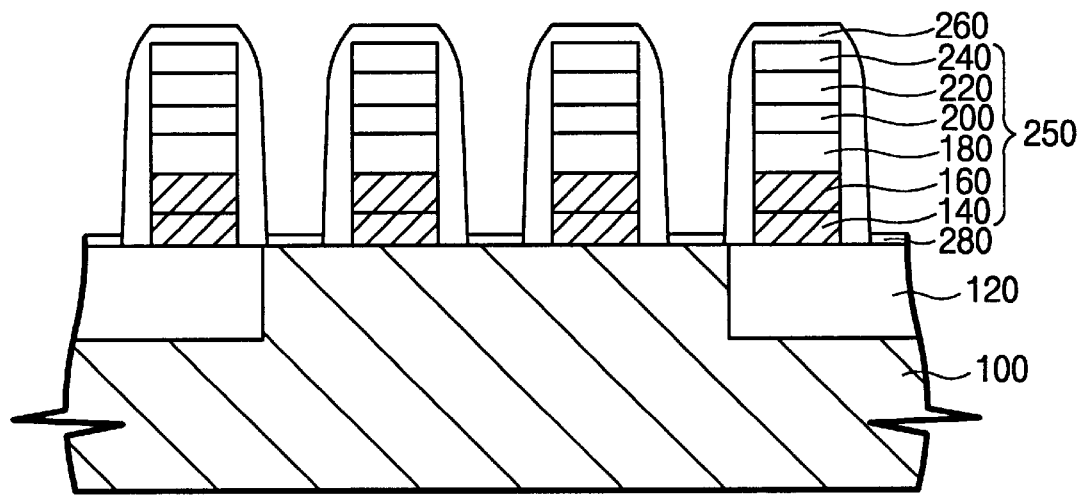
FIG. 4A to FIG. 4H are cross-sectional views of the preferred embodiment of the present invention for forming the SAC contact pad, which are taken along the line IV–IV' of FIG. 3.
Figure 5:
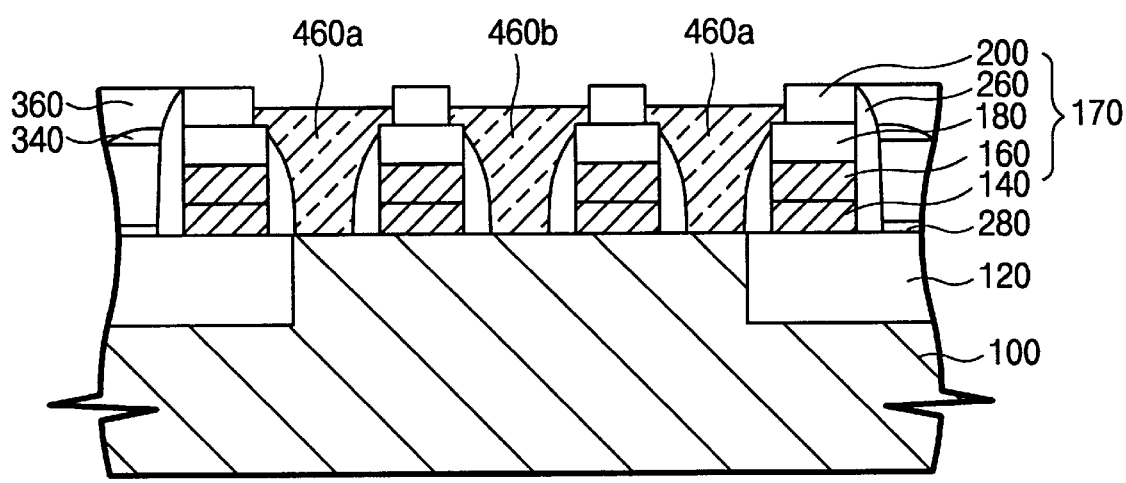
FIG. 5 is a cross-sectional view showing a completed SAC contact pad manufactured according to a preferred embodiment of the present invention.

Referring to FIG. 4A, a device isolation region 120 is formed in a predetermined region of a semiconductor substrate 100 to define active and inactive regions. The device isolation region 120 may be formed by any suitable method that is well known in the art, e.g., shallow trench isolation (STI) or local oxidation of silicon (LOCOS). Though not shown in the drawings a gate oxide layer is formed over the semiconductor substrate 100 by a conventional method to have a thickness of about 50 Å to 100 ÅA. The gate oxide layer serves to insulate between the substrate and the later-formed gate electrode.

A gate electrode conductive layer and gate mask layer are then laminated over the gate oxide layer. The gate electrode conductive layer is preferably a multiple layer, including a first gate electrode conductive layer 140 and a second gate electrode conductive layer 160. In the preferred embodiment of the present invention, the first gate electrode conductive layer 140 comprises polysilicon with a thickness of about 1000 Å, and the second gate electrode conductive layer comprises tungsten silicide with a thickness of about 1000 Å.

The gate mask layer is preferably formed of a material that has different etching selectivity from a subsequently-formed interlayer insulating film. In the preferred embodiment of the present invention, the gate mask layer is laminated with first through fourth material layers 180, 200, 220, and 240, and the second material layer 200 will be undercut during a subsequent portion of the SAC forming process. Also, the second material layer 200 preferably has different etching selectivity from the underlying first gate mask 180 and the overlying third material layer 220. In addition, the second material layer 200 serves as an etch stop layer during subsequent planarization process for SAC contact pad formation, thereby isolating the contact pads from each other, and increasing the SAC dimension to a degree corresponding to the undercut dimension of the second material layer.

More particularly, the first material layer 180 of the gate mask is preferably formed of a conventional LPCVD silicon nitride and preferably has a thickness of about 500 Å to 1000 Å. The third material layer 220 of the gate mask is preferably formed of polysilicon and preferably has a thickness of about 500 Å to 700 Å. In contrast, the second material layer 200 of the gate mask is preferably formed of a material selected from the group consisting of an oxide, an ARC material, a P-nitride (phosphorous nitride), and a nitride that has different etching selectivity from the first material layer 180. The second material layer 200 preferably has a thickness of about 500 Å to 1000 Å. The fourth material layer 240 of the gate mask is preferably made of an oxide and preferably has a thickness of about 500 Å. In alternate embodiments, the fourth material layer 240 may be omitted.

A conventional photolithography process is conducted on the electrode conductive layer and the gate mask layer to form an initial gate electrode structure 250, i.e., first through fourth material layers 180, 200, 220 and 240 and first and second gate electrode conductive layers 140 and 160.

Low concentration impurity ions are then implanted into the active region in the semiconductor substrate 100 outside of the initial gate electrode structures 250. A material layer to be used as a gate spacer is then formed over the initial gate electrode structures 250 to a thickness of preferably about 300 Å to 1000 Å. This material layer is then etched back to form the gate spacer 260 and to fully coat the initial gate electrode structure 250. The gate spacer 260 preferably has an etching selectivity with respect to a subsequently-formed interlayer insulating film and is preferably formed of a material such as silicon nitride (SiN). Thereafter, high concentration impurity ions are implanted into the active region in the semiconductor substrate 100 outside of the gate spacer 260.

Referring to FIG. 4A, a first etch stop layer 280 is deposited over the exposed semiconductor substrate 100 to have a thickness of preferably about 50 Å to 200 Å. The first etch stop layer 280 is preferably formed of silicon nitride, which has an etching selectivity with respect to the subsequently-formed interlayer insulating film.

Figure 4B:
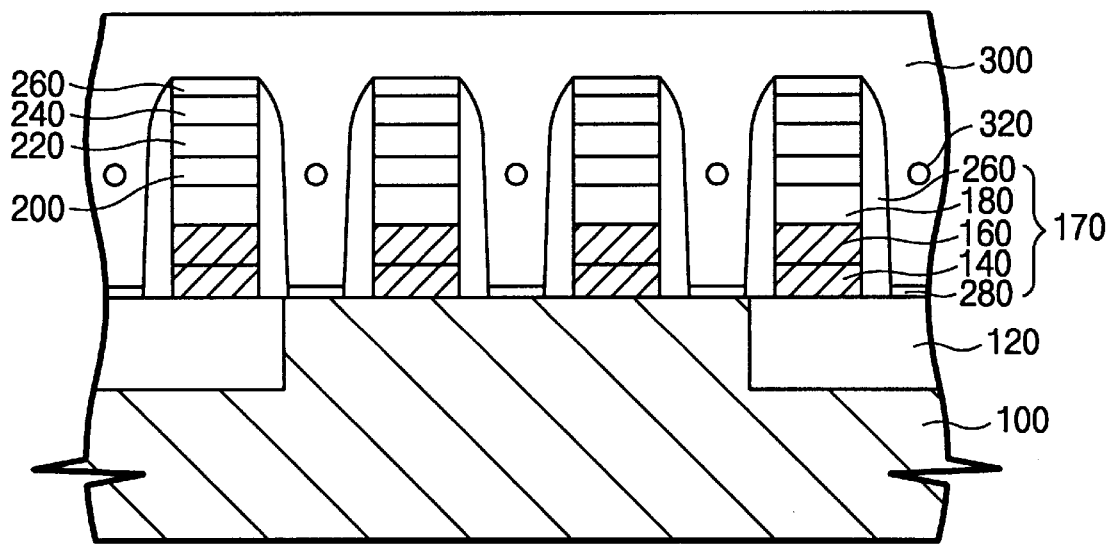

Referring to FIG. 4B, a first interlayer insulating film 300 is deposited over the substrate 100 and the initial gate electrode structure 250 to blanket the initial gate electrode structures 250. The first interlayer insulating film 300 is preferably deposited to have a thickness of about 3000 Å to 5500 Å and is preferably formed of a high density plasma (HDP) chemical mechanical deposition (CVD) oxide layer.

In the preferred embodiment of the present invention, the first interlayer insulating film 300 is deposited through three steps so as to suppress the creation of voids 320 as much as possible. First, a thick-oxide layer about 2000 Å is deposited. Second, argon or helium sputtering is conducted to provide a suitable state for subsequent filling. Third, oxide depositing and sputtering are preferably performed simultaneously to form an oxide of a predetermined thickness.

However, even when the interlayer insulting film 300 is deposited through the process mentioned above, undesirable voids 320 can be formed as the pattern size is reduced and the density is increased. Such voids 320 may bring about a bridge between a pair of storage node contacts or between a pair of bit line contacts.

Figure 4C:
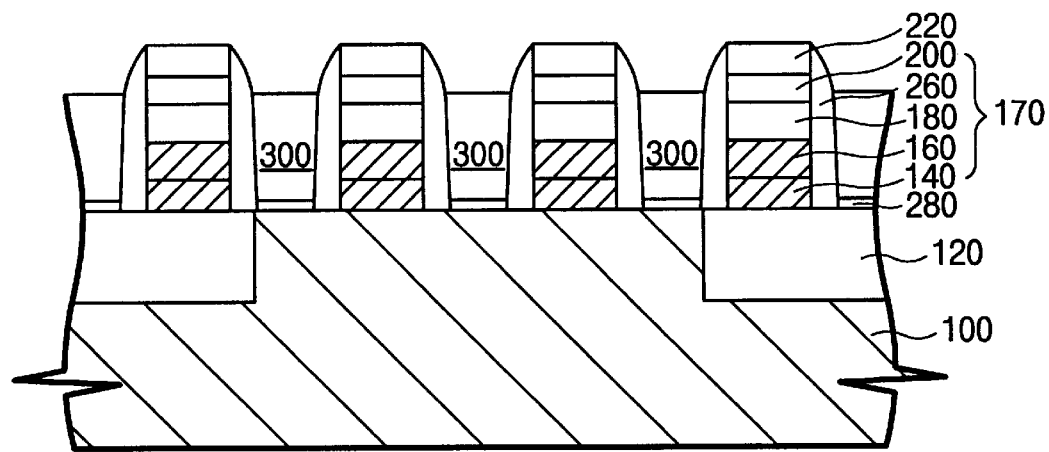

For this reason, in the present invention, an etch-back is conducted on the first interlayer insulating film 300, as shown in FIG. 4C. This etch-back is performed so that any voids 320 in the first interlayer insulating film therein are exposed and preferably reduces the first interlayer insulating film 300 to a thickness of about 1500 Å to 2000 Å. The first interlayer insulating film 300 is etched to a level in height equal to or less than that of the second material layer of the gate mask layer.

During this step, the gate spacer 260 and the gate mask have good etching selectivity with respect to the first interlayer insulating film 300 thereby serving as an etch stop layer. However, the etch-back of the first interlayer insulating film 300 may etch away the upper portion of the gate spacer 260 and the fourth material layer 240 of the gate mask without departing from the spirit and scope of the present invention.

The etch-back of the first interlayer insulating film 300 may be carried out by a wet etch, a dry etch, or a combination of wet and dry etching. Preferably a wet etch is used, due to its good etch selectivity ratio. In the case of wet etch, a conventional etchant for an oxide layer may be used, e.g., 200:1 HF, LAL (mixed solution of HF and $NH_4F$), and BOE (buffered oxide etchant). In the case of a dry etch, $O_2$, $CF_4$, CO (carbon monoxide), Ar (argon), $CH_2F_2$, $CHF_3$, $N_2$, and $CH_4$ may be used.

Figure 4D:
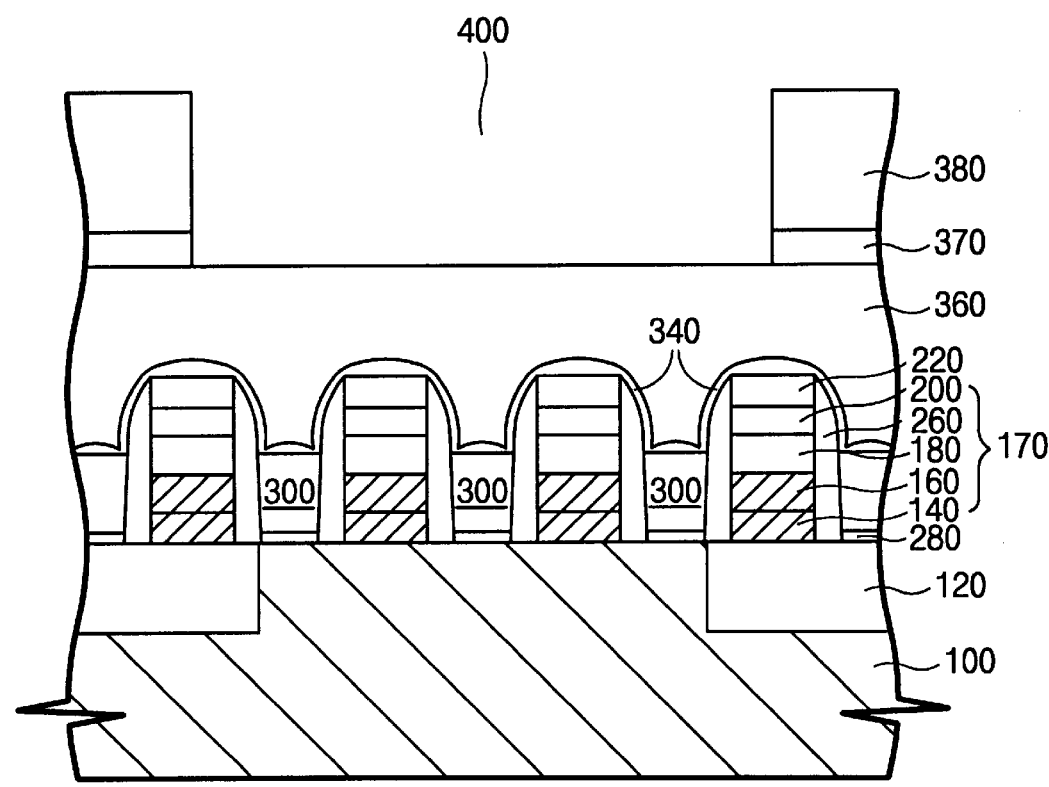

Referring to FIG. 4D, after the etch-back the first interlayer insulating 300, a second etch stop layer 340, used for a subsequent undercut etching process is formed over the first interlayer insulating film 300 to have a thickness of about 50 Å to 200 Å. The second etch stop layer 340 is preferably formed of silicon nitride, which has an etching selectivity with respect to a subsequent second interlayer insulating film. The second interlayer insulating film 360 is deposited over the semiconductor substrate 100 so as to completely blanket the initial gate structure 250. The second interlayer insulating film 360 preferably comprises silicon nitride.

A planarization process can be conducted on the second interlayer insulating film 360 to improve subsequent photolithography margins. The planarization is preferably performed by CMP, and the second interlayer insulating film 360 preferably has a thickness of about 500 Å to 1000 Å from the top surface of the gate structure after this planarization process.

An anti-reflection coating (ARC) layer 370 is then formed over the second interlayer insulating film 360 so as to minimize critical dimension (CD) variation. After that, a photoresist layer is formed over the ARC layer 370 and is patterned into a predetermined configuration, i.e., a photoresist pattern 380. The photoresist pattern 380 has "T" shaped opening portion 400 as shown in FIG. 3. More particularly, the opening portion 400 preferably includes two storage node contact regions and one bit line contact region thereby forming a merge contact. Such merge contact has an increased opening size in comparison to the conventional circular or elliptical openings shown in FIG. 1, while the opening size is smaller than that of the structure disclosed by Y.Kohyama et al., mentioned in the background of the invention. This design operates to prevent an disclosed etch stop phenomenon and to improve the etch selectivity ratio.

Figure 4E:
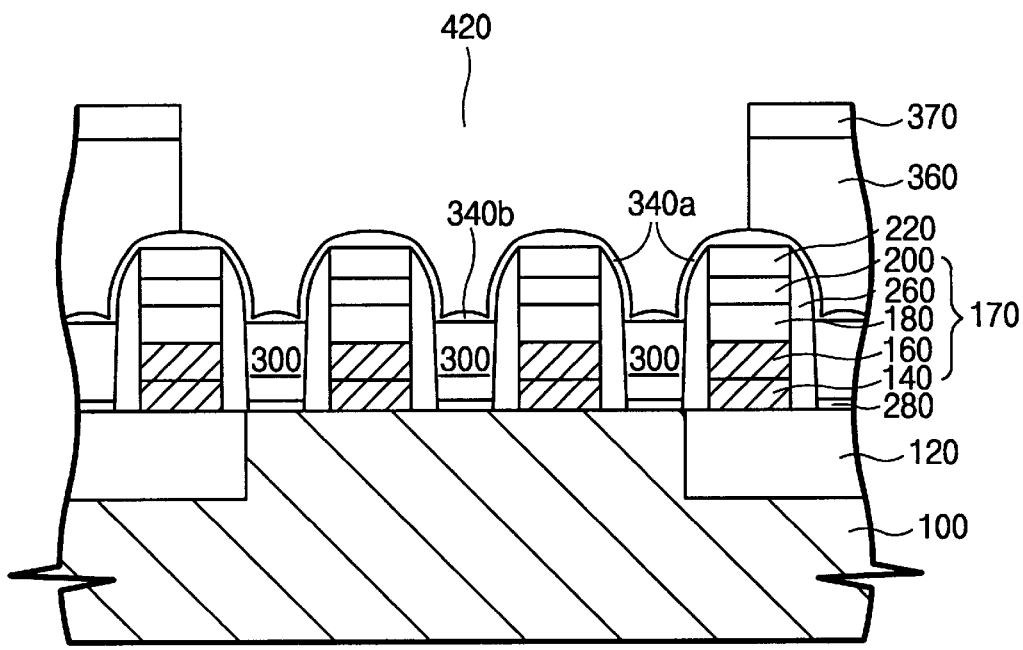

Referring to FIG. 4E, the second interlayer insulating film 360 is then dry etched using the photoresist pattern 380 as a mask until the second etch stop layer 340 is exposed, to form an opening for an SAC contact pad. Here, the etch is preferably performed under the etching recipe such that the second interlayer insulating film 360 has an etching selectivity with respect to the polysilicon layer 220, gate spacer 260, and the second etch stop layer 340. More particularly, at the early stage of the etching, the second interlayer insulating film 360 is preferably etched vertically down along the interface of the photoresist pattern 380.

However, if the etching process continues to expose the second etch stop layer 340a over the gate structure, only the edge portions of the second etch stop layer 340a over the gate structure are etched away due to the etch selectivity ratio. In this case, the etching process continues down along the second interlayer insulting film 360 between the pair of the gate structure until the second etch stop layer 340b is exposed. At this point, all of the second etch stop layer 340 may be etched away to expose the polysilicon layer 220. After that, the photoresist pattern 380 is completely removed.

Figure 4F:
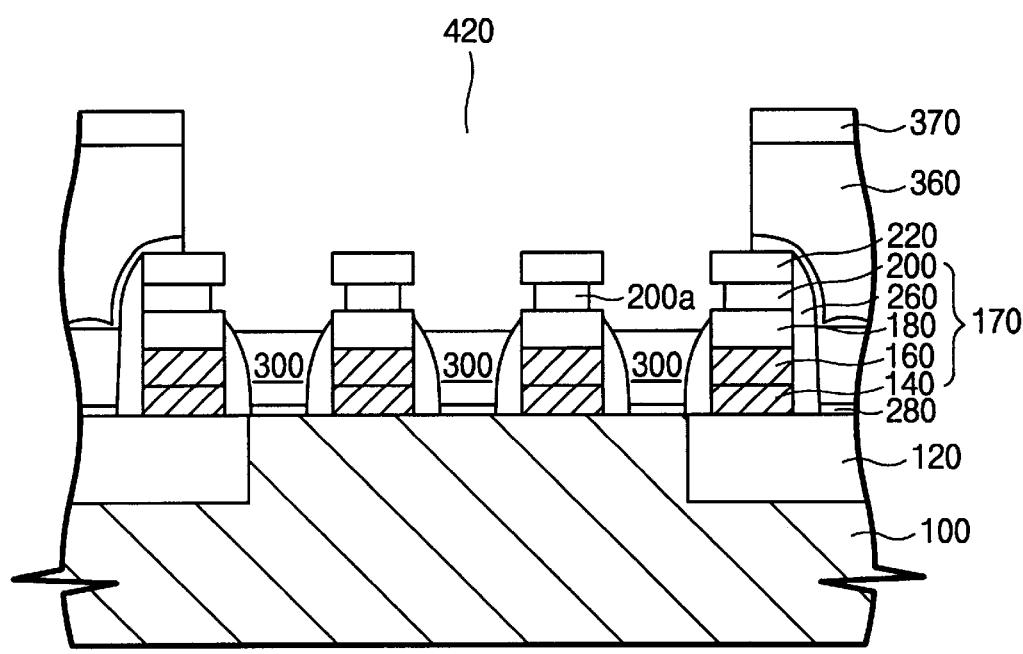

Referring to FIG. 4F, the second material layer 200 of the gate mask is undercut by isotropic wet etching. The wet etching preferably uses phosphoric acid at 165° C., and is controlled in such a manner that it etches away the second etch stop layer 340 and a portion of the side spacer 260, and undercuts the second material layer 200 of the gate mask. In particular, the wet etching is preferably performed for about 5 to 30 minutes, most preferably for about 5 minutes, and the lateral dimension of the undercut is preferably about one third of the gate pattern size. Then, the first interlayer insulating film 300 and the first etch stop layer 280 are removed to completely form an opening 420 for the SAC contact pad, which exposes a portion of the semiconductor substrate 100.

Figure 4G:
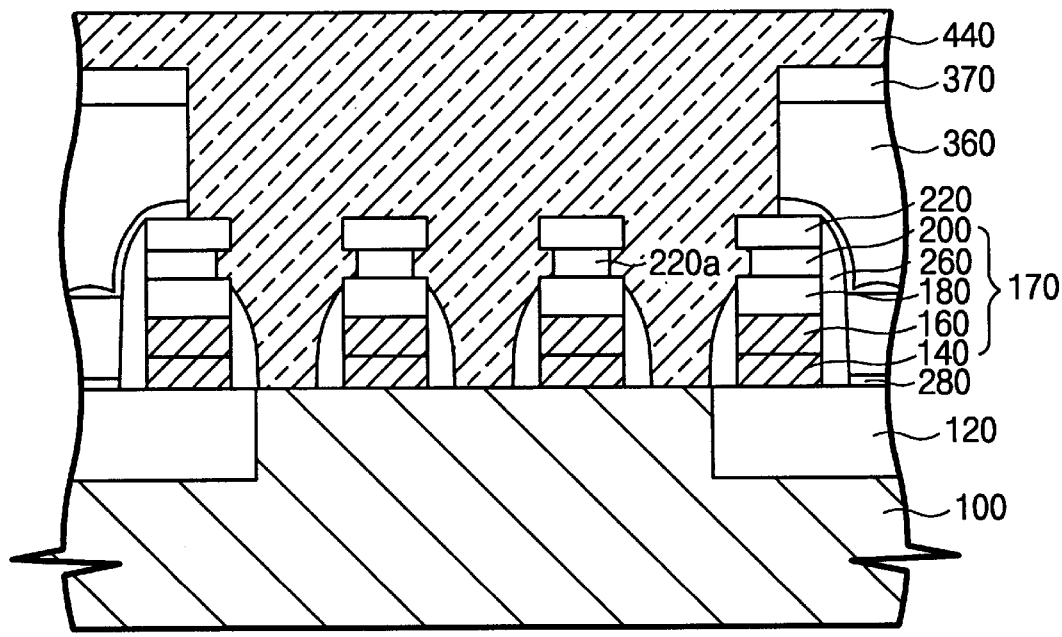

The opening 420 is then filled up with a conductive layer 440, such as a doped polysilicon layer, as shown in FIG. 4G. The polysilicon layer 440 is preferably deposited to have a thickness of about 3500 Å to 5700 Å.

Figure 4H:
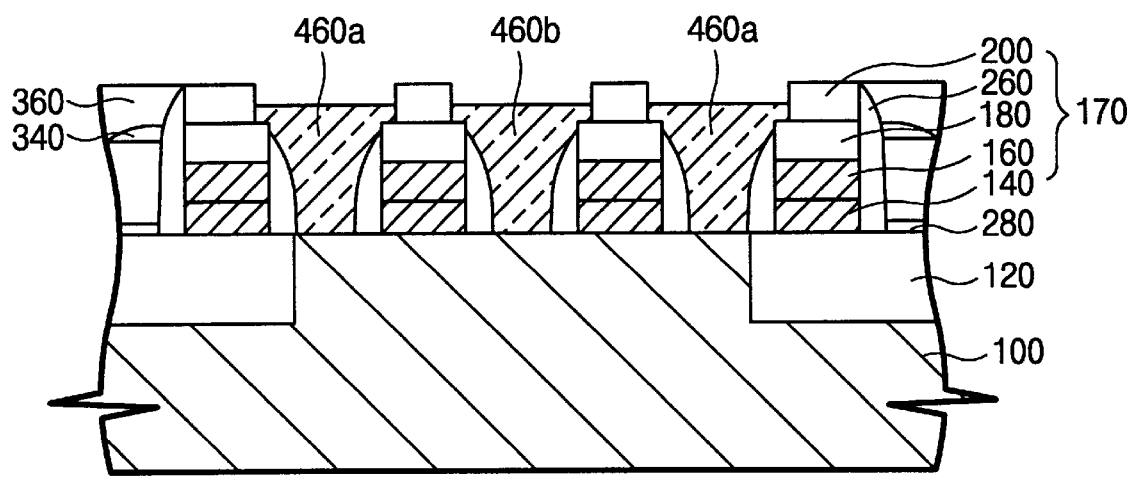

Referring to FIG. 4H, the polysilicon layer 440 is then planarized, preferably by a CMP or an etch-back process. During this step, the second material layer 200 of the gate structure serves as an etch stop layer. As a result, the third material layer 220 is removed, leaving a plurality of gate structures 170, each covered by a portion of the second material layer 200. After the planarization process, the SAC contact pads 460a and 460b are formed as a storage node and bit line, respectively.

Because of the undercutting of the second material layer 200, the contact pads 460a and 460b are not only formed in the space between a pair of gate structures 170, but also over portions of the gate structures 170, thereby increasing the upper surfaces of the contact pads 460a and 460b, and allowing for a greater misalignment margin in subsequent processes of the bit line and storage node formation.

Thereafter, a conventional storage node and bit line forming process may be performed.

As can be understood from this explanation, in accordance with the present invention, the second material layer 200 of the gate mask has different etching selectivity compared to the first and third material layers 180 and 220 of the gate mask, so that the second material layer 200 is undercut during the formation of an opening for a SAC contact pad, thereby increasing the misalignment margin. In addition, the photoresist pattern has a "T" shaped opening portion merged with two storage node contact regions and one bit line contact region, thereby increasing the etch selectivity ratio between the interlayer insulating film and the nitride layer of the gate spacer and gate mask. Also, the interlayer insulating film is etched back so as to remove the voids therein and then an additional interlayer insulating film is redeposited to blanket the gate structure.

While this invention has been particularly shown and described with reference to the preferred embodiments thereof, it will be understood by those skilled in the art that various changes in form and details may be made without departing from the spirit and scope of this invention.

What is claimed is:

1. A method for forming a self aligned contact pad in a semiconductor device, comprising:

forming a plurality of stacked conductive structures over a semiconductor substrate, each of the stacked conductive structures comprising a first conductive layer, a multiple capping layer including at least stacked first, second, and third material layers, and a sidewall spacer coating the first conductive layer and the capping layer, and each of the stacked conductive structures being spaced from each other;

forming an interlayer insulating film over the semiconductor substrate and the plurality of stacked conductive structures;

etching the interlayer insulating film to form openings for a contact pads that expose the semiconductor substrate;

undercutting the second material layer of the capping layer;

filling the opening with a second conductive layer such that the second conductive layer contacts exposed portions of the semiconductor substrate; and planarizing the second conductive layer until upper surfaces of the second material layer of the capping layers are exposed to form self aligned contact pads that are electrically insulated from adjacent contact pad by the second material layer.

2. A method for forming a self aligned contact pad in a semiconductor device, as recited in claim 1, wherein the second material layer of the capping layer has different etching selectivity from the first and third material layers of the capping layer.

3. A method for forming a self aligned contact pad in a semiconductor device, as recited in claim 2, wherein the first material layer comprises an LPCVD nitride, the third material layer comprises polysilicon, and the second layer comprises a material selected from the group consisting of an anti-reflection coating, a phosphorous nitride, an oxide, and a nitride that has different etching selectivity from the first material layer.

4. A method for forming a self aligned contact pad in a semiconductor device, as recited in claim 1, wherein the undercutting of the second material layer is performed by wet etching.

5. A method for forming a self aligned contact pad in a semiconductor device, as recited in claim 1, wherein the multiple capping layer further comprises a fourth material layer.

6. A method for forming a self aligned contact pad in a semiconductor device, as recited in claim 1, wherein the forming of the interlayer insulating film comprises:

forming a first etch stop layer over the semiconductor substrate and the plurality of stacked conductive structures;

forming a first interlayer insulating film over the first etch stop layer;

etching the first interlayer insulating film between the plurality of stacked conductive structures to expose voids in the first interlayer insulating film;

forming a second etch stop layer over the first interlayer insulating film; and forming a second interlayer insulating film over the second etch stop layer to blanket the plurality of stacked conductive structures.

7. A method for forming a self aligned contact pad in a semiconductor device, as recited in claim 6, wherein the etching of the interlayer insulating film comprises:

selectively the second interlayer insulating film until upper surfaces of the second etch stop layer are exposed;

etching the second etch stop layer and a portion of the sidewall spacer to expose the third material layer;

undercutting the second material layer of the capping layer; and etching the first interlayer insulating film and the first etch stop layer.

8. A method for forming a self aligned contact pad in a semiconductor device, as recited in claim 6, wherein the first interlayer insulating film between the plurality of stacked conductive structures is etched to the same level in height the second material layer or lower than thereof.

9. A method for forming a self aligned contact pad in a semiconductor device, as recited in claim 7, wherein the undercutting of the second material layer is performed by wet etching.

10. A method for forming a self aligned contact pad in a semiconductor device, as recited in claim 6, wherein the first and second etch stop layers have different etching selectivity from the first and second interlayer insulating films.

11. A method for forming a self aligned contact pad in a semiconductor device, as recited in claim 10, wherein the first and second etch stop layers comprise silicon nitride.

12. A method for forming a self aligned contact pad in a semiconductor device, as recited in claim 6, wherein the forming of the first interlayer insulating film comprises:

depositing a first insulating material over the substrate and the plurality of gate structures;

sputtering argon or helium over the substrate and the plurality of gate structures; and performing simultaneously depositing and sputtering a second insulating material over the substrate and the plurality of gate structures.

13. A method for forming a self aligned contact pad in a semiconductor device, as recited in claim 6, wherein the etching of the first interlayer insulating film is performed by one of dry etching, wet etching, and a combination of dry etching and wet etching.

14. A method for forming a self aligned contact pad in a semiconductor device, as recited in claim 1, wherein the capping layer and spacer have different etching selectivity as compared to the interlayer insulating film.

15. A method for forming a self aligned contact pad in a semiconductor device, as recited in claim 1, further comprising planarizing the interlayer insulating film.

16. A method for forming a self aligned contact pad in a semiconductor device, as recited in claim 1, wherein the mask pattern has a 'T' shaped opening including at least two storage node contact regions and one bit line contact region.

17. A method for forming a self aligned contact pad in a semiconductor device, comprising:

forming a plurality of stacked gate structures over a semiconductor substrate having active and inactive regions, each stacked gate structure comprising a gate electrode conductive layer, a gate mask layer at least including stacked first through third material layers, and a gate spacer coating the gate electrode conductive layer and the gate mask layer, the stacked gate structures being spaced form each other;

forming a first etch stop layer over the semiconductor substrate;

forming a first interlayer insulating film over the first etch stop layer and the plurality of stacked gate structures;

etching the first interlayer insulating film between pairs of the plurality of gate structures to expose voids in the first interlayer insulating layer;

forming a second etch stop layer over the first interlayer insulating film;

forming a second interlayer insulating film over the second etch stop layer to blanket the plurality of gate structures;

forming a mask pattern over the second interlayer insulating film, the mask having a 'T' shaped opening, wherein the 'T' shaped opening portion includes at least two different contact regions of two storage node contact regions and one bit line contact region;

etching the second interlayer insulating film, the second etch stop layer, the first interlayer insulating film, and the first etch stop layer, using the mask pattern, to form openings for contact pads that exposes the semiconductor substrate;

undercutting the second material layer of the gate mask, wherein the undercutting of the mask comprises:

etching the second interlayer insulating film until the second etch stop layer is exposed;

undercutting the second material layer of the gate mask with wet etching in phosphoric acid;

etching the first interlayer insulating film until the first etch stop layer is exposed; and removing the first etch stop layer;

filling the opening with a contact pad conductive layer; and forming a contact pad by planarizing the contact pad conductive layer such that the second material layer of the gate mask is exposed.

18. A method for forming a self aligned contact pad in a semiconductor device, as recited in claim 17, wherein the gate mask, the gate spacer, the first etch stop layer, and the second etch stop layer all have a different etching selectivity as compared to the first and second interlayer insulating films.

19. A method for forming a self aligned contact pad in a semiconductor device, as recited in claim 17, wherein the gate mask layer further comprises a fourth material layer.

* * * * *